(12) United States Patent
Yoon

(10) Patent No.: US 7,778,071 B2
(45) Date of Patent: Aug. 17, 2010

(54) PHASE CHANGE MEMORY DEVICE HAVING DECENTRALIZED DRIVING UNITS

(75) Inventor: Hyuck Soo Yoon, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 228 days.

(21) Appl. No.: 12/164,175

(22) Filed: Jun. 30, 2008

(65) Prior Publication Data

US 2009/0161418 A1 Jun. 25, 2009

(30) Foreign Application Priority Data

Dec. 21, 2007 (KR) ........................ 10-2007-0134985

(51) Int. Cl.
*G11C 11/00* (2006.01)
(52) U.S. Cl. ............. 365/163; 365/185.23; 365/185.25; 365/63
(58) Field of Classification Search ................. 365/163, 365/185.23, 185.25, 63
See application file for complete search history.

(56) References Cited

U.S. PATENT DOCUMENTS

| 5,625,598 | A | 4/1997 | Oba |
| 6,337,824 | B1 * | 1/2002 | Kono et al. ................. 365/207 |
| 6,567,296 | B1 | 5/2003 | Casagrande et al. |
| 6,667,900 | B2 | 12/2003 | Lowrey et al. |
| 7,573,766 | B2 * | 8/2009 | Choi et al. .................. 365/201 |
| 2008/0062741 | A1 * | 3/2008 | Choi et al. .................. 365/148 |
| 2008/0316806 | A1 * | 12/2008 | Nakai et al. ................. 365/163 |
| 2009/0116309 | A1 * | 5/2009 | Hanzawa et al. ........ 365/189.15 |
| 2009/0201753 | A1 * | 8/2009 | Riho et al. .................. 365/200 |
| 2009/0310403 | A1 * | 12/2009 | Choi .......................... 365/163 |
| 2010/0085804 | A1 * | 4/2010 | Katagiri et al. ............. 365/163 |

FOREIGN PATENT DOCUMENTS

| KR | 1020010058893 A | 7/2001 |
| KR | 1020030002203 A | 1/2003 |
| KR | 1020060001489 A | 1/2006 |
| KR | 1020060080545 A | 7/2006 |
| KR | 1020060134308 A | 12/2006 |
| KR | 10-0699890 B1 | 3/2007 |

* cited by examiner

*Primary Examiner*—Tuan T. Nguyen
(74) *Attorney, Agent, or Firm*—Ladas & Parry LLP

(57) ABSTRACT

A phase change memory device includes a plurality of intersecting bit lines and word lines. A cell array including a plurality of unit phase change resistance cells is formed at intersections of the plurality of bit lines and the plurality of word lines. A plurality of sub word line driving units are configured to drive the word lines in response to a plurality of sub word line signals. A plurality of main word line driving units are configured to drive the sub word line driving units in response to a main word line signal. A precharge unit is configured to precharge the word lines. In the phase change memory device, the driving units are decentralized.

14 Claims, 5 Drawing Sheets

PHASE CHANGE MEMORY DEVICE HAVING DECENTRALIZED DRIVING UNITS

CROSS-REFERENCE TO RELATED APPLICATIONS

The present application claims priority to Korean Patent Application No. 10-2007-0134985 filed on Dec. 21, 2007, which is incorporated herein by reference in its entirety.

BACKGROUND OF THE INVENTION

The present invention relates generally to a phase change memory device, and more particularly, to a phase change memory device having decentralizing drivers for driving word lines to a ground voltage to minimize the resistance in the word line.

Phase change memory (PRAM) devices are a type of nonvolatile memory currently being developed and gaining in popularity. Since the PRAM is nonvolatile, it conserves data even after the power is turned off.

A unit cell of the PRAM device uses a phase change material as a data storage medium. The phase change material has two stable states (amorphous phase and crystalline phase), and the phase of the material depends on the heat applied to the material. Typically, the phase change material is GST (Ge—Sb—Te), which is a compound of germanium (Ge), stibium (Sb), and tellurium (Te).

The GST phase change material becomes amorphous when the GST is heated close to the melting point of the GST for a short period of time and then rapidly cooled. Conversely, the GST phase change material becomes crystalline when the GST is heated at a crystallization temperature lower than the melting point for a long period of time and then slowly cooled. The amorphous GST has a higher resistance than that of the crystalline GST. Using this phenomenon, current flowing through the phase change material is sensed, making it possible to judge whether information stored in the cell of the PRAM is data logic value "1" (amorphous phase) or a data logic value "0" (crystalline phase).

In the PRAM device, Joule heating is performed on the phase change material. That is, current is supplied to an electrode connected to the phase change material. The current supplied to the electrode generates heat, and the heat is supplied to the phase change material. The amount of the heat supplied to the phase change material depends on the amount of the supplied current.

FIG. 1 is a circuit diagram showing a unit phase change resistance cell.

The unit phase change resistance cell C includes a phase change resistor PCR and a diode D. The PCR has a first electrode connected to a word line WL and a second electrode connected to an N-type region of the diode D. The P-type region of the diode D is connected to the bit line BL, and the N-type region is connected to the word line WL. Current flows through the PCR when the bit line BL becomes a high level and the word line WL becomes a low level. At this time, the PCR can be changed to a crystalline or amorphous phase according to the current flowing through the bit line BL.

FIG. 2 is a diagram showing a phase change memory device.

The phase change memory device comprises a cell array CA, a word line driving unit 10, a decoding unit 20, and a bit line driving unit 30.

The cell array CA includes a plurality of bit lines BL0~BLn arranged in a column direction and a plurality of word lines WL0~WL3 arranged in a row direction. The cell array CA includes a plurality of unit phase change resistance cells C each of which is positioned at the intersection of one of the bit lines BL0~BLn and one of the word lines WL0~WL3.

The word line driving unit 10 includes a plurality of drivers each configured to drive an output signal of the decoding unit 20 in order to supply the output signal to the word lines WL0~WL3. The driver includes a plurality of inverters IV1~IV4 each of which is connected to one of the word lines WL0~WL3. The inverter IV1 inverts the output signal of the decoding unit 20 and outputs the inverted signal to the word line WL0. The inverter IV2 inverts the output signal of the decoding unit 20 and outputs the inverted signal to the word line WL1. The inverter IV3 inverts the output signal of the decoding unit 20 and outputs the inverted signal to the word line WL2. The inverter IV4 inverts the output signal of the decoding unit 20 and outputs the inverted signal to the word line WL3.

The decoding unit 20 decodes a row address and outputs the decoded row address. The bit line driving unit 30 supplies a write voltage corresponding to the data state of the bit line BL.

When in write mode, the selected bit line BL becomes a high level, and the selected word line WL becomes a low level. Therefore, a current path is formed from the bit line BL to the word line WL. The current for writing data depends on the structure of the word line WL; and therefore, the resistance Rwl in the word line WL is required to be small, and the electric potential of the word line WL is required to be at a ground voltage VSS level.

However, the resistance Rwl in the word line WL increases as the length of the word line WL becomes longer and the distance between word lines WL becomes narrower. The larger resistance Rwl causes a reduction in the current flowing through the PCR, and as a consequence data cannot be written normally.

Additionally, in this case, an increased loading time of the word line WL requires a larger driving unit 10 so that word line WL can be driven to the ground voltage VSS level. However, with a highly integrated device the distance between the word lines WL is narrower limiting the ability to form a large driving unit 10. Moreover, when a decoding unit is added, the chip size increases.

SUMMARY

The present invention includes is a phase change memory device.

Various embodiments of the present invention include a phase change memory device having decentralizing driving units for driving word lines to a ground voltage in the word line to minimize resistance in the word line.

Additionally, embodiments of the present invention include hierarchical-driving word lines using a main word line signal and a sub word line signal to maximize current sink capacity.

Additionally, embodiments of the present invention include simultaneously controlling a plurality of word lines using a main word line signal to reduce the size of a row address decoder.

Additionally, embodiments of the present invention include connecting a driver controlled by a main word line signal in series to a driver controlled by a sub word line signal to minimize current reduction resulting from line resistance.

Additionally, embodiments of the present invention include fixing a non-selected word line at a high voltage level when in active mode so that the non-selected word line is not floating, thereby preventing leakage current caused by a floating word line.

According to an embodiment of the present invention, a phase change memory device comprises: a cell array including a plurality of unit phase change resistance cells positioned at intersections of a plurality of bit lines and a plurality of word lines; a plurality of sub word line driving units configured to drive the word lines in response to a plurality of sub word line signals; a plurality of main word line driving units configured to drive the sub word line driving units in response to a main word line signal; and a precharge unit configured to precharge the word lines.

DETAILED DESCRIPTION

Figure 1:
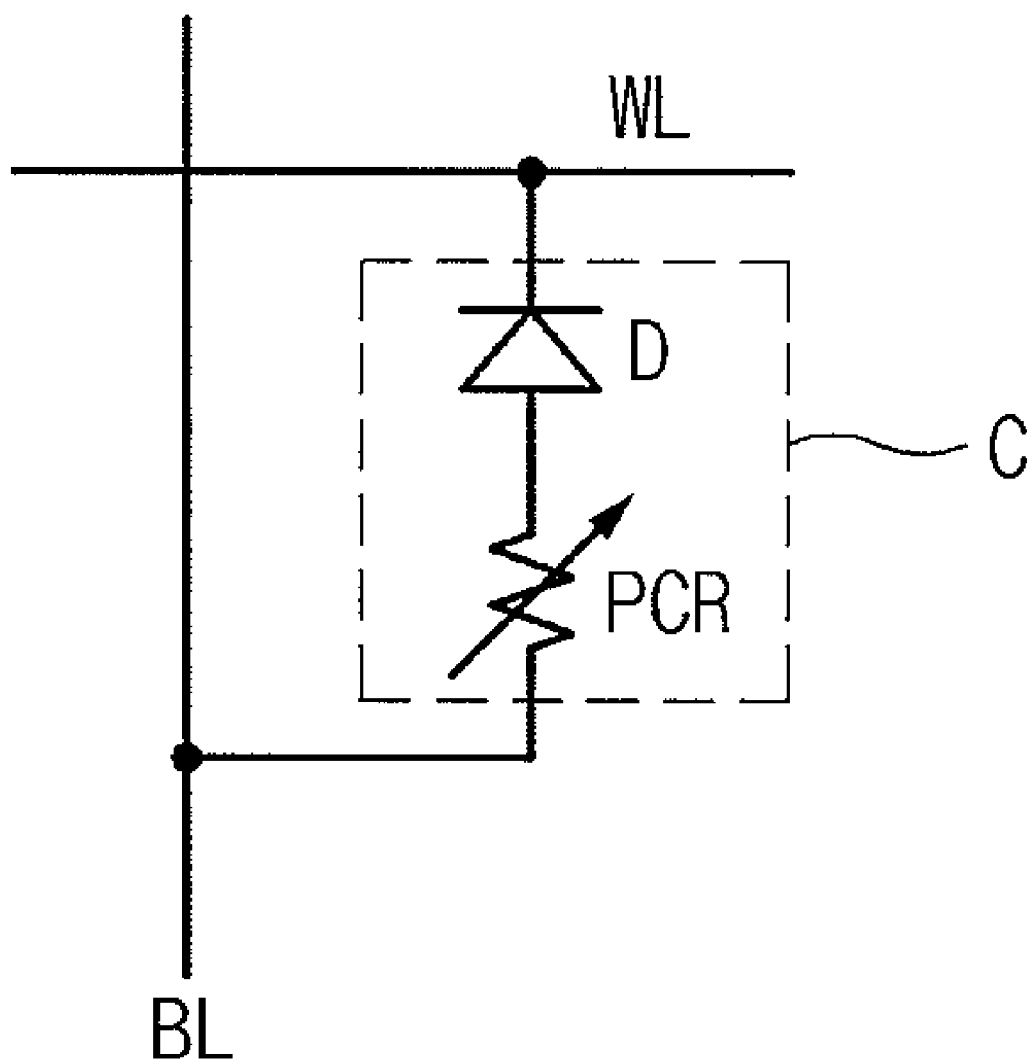
FIG. 1 is a circuit diagram showing a unit phase change resistance cell.
Figure 2:
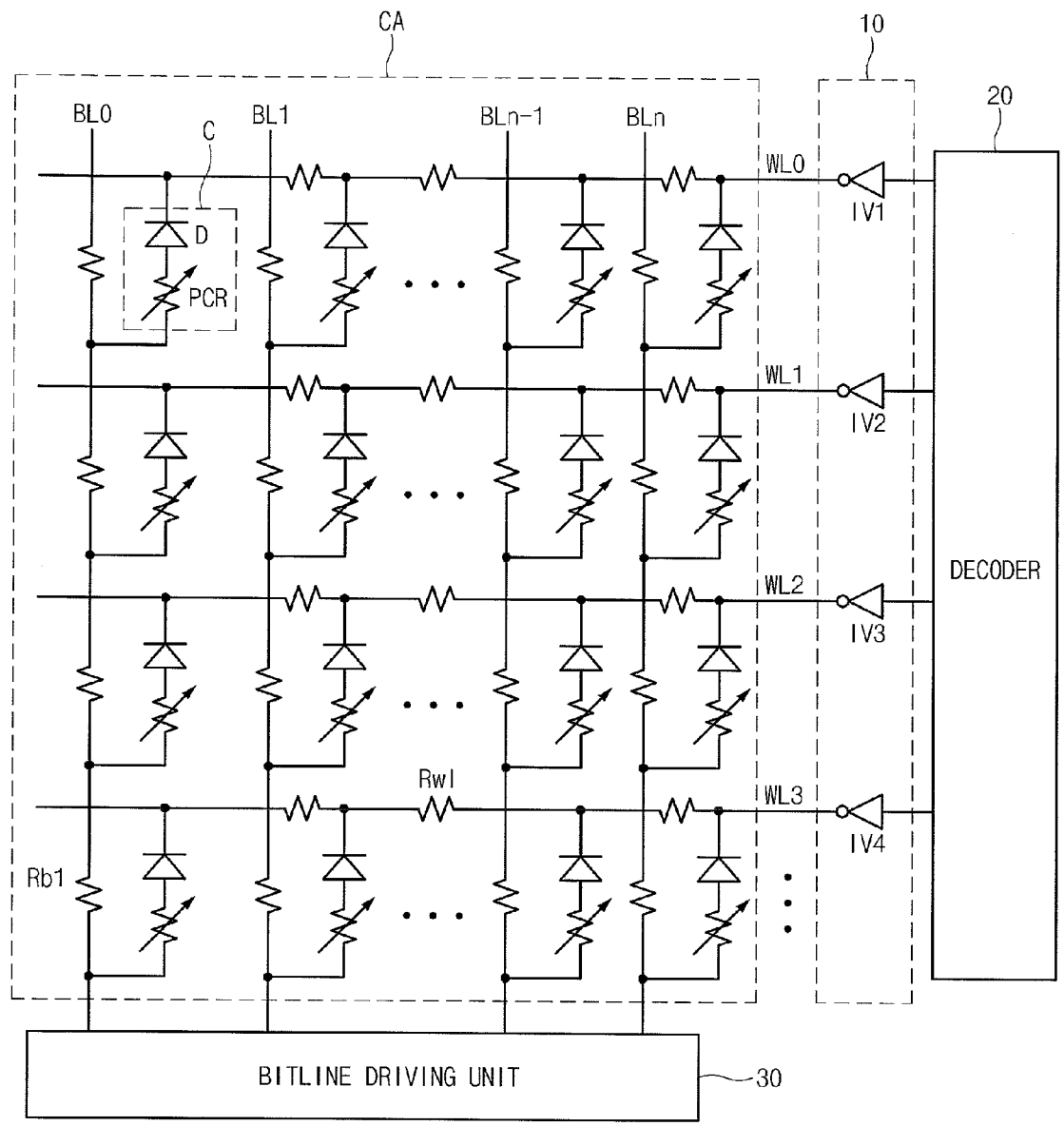
FIG. 2 is a diagram showing a phase change memory device.
Figure 3:
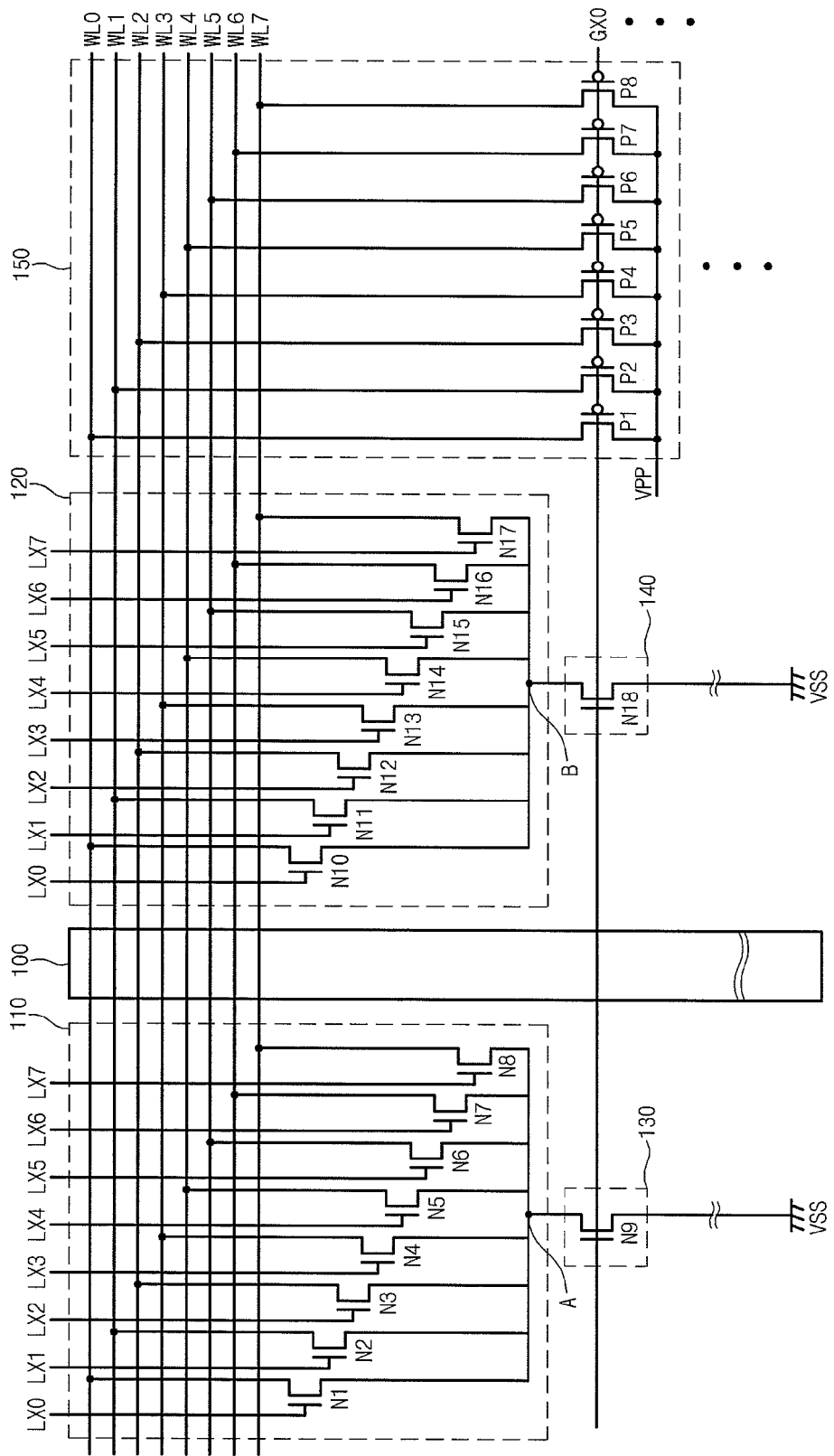
FIG. 3 is a circuit diagram showing a phase change memory device according to an embodiment of the present invention.

FIG. 3 is a circuit diagram showing a phase change memory device according to an embodiment of the present invention.

The phase change memory device of FIG. 3 comprises a cell array 100, sub word line driving units 110, 120, main word line driving units 130, 140, and a precharge unit 150. In this embodiment a 10 bit row address is shown as an example.

The cell array 100 includes a plurality of unit phase change resistance cells (not shown) positioned at intersections of a plurality of bit lines (not shown) and a plurality of word lines WL0~WL7.

The sub word line driving unit 110 includes a plurality of drivers configured to drive one selected from the plurality word lines WL0~WL7 to a ground voltage VSS level in response to a plurality of sub word line signals LX0~LX7. Preferably, the drivers comprise NMOS transistors N1~N8.

Each of the NMOS transistors N1~N8 connect one of the word lines WL0~WL7 to a node (A). Each gate of the NMOS transistors N1~N8 receives one of the line signals LX0~LX7. Preferably, the sub word line signals LX0~LX7 are obtained by decoding lower bits XA0~XA2 of the row address. The circuit for decoding the lower bits XA0~XA2 of the row address is a typical decoding circuit, and therefore a detailed diagram of the circuit is not shown in FIG. 3.

The sub word line driving unit 120 includes a plurality of drivers configured to drive one selected from the plurality of word lines WL0~WL7 to a ground voltage VSS level in response to the sub word line signals LX0~LX7. Preferably, the drivers comprise NMOS transistors N10~N17. Each of the NMOS transistors N10~N17 connect one of the word lines WL0~WL7 to a node (B). The gate of each of the NMOS transistors N10~N17 receives one of the sub word line signals LX0~LX7.

Although the sub word line driving units 110 and 120 are located at both sides of the cell array 100 in the embodiment shown in FIG. 3, the present invention is not limited to this embodiment. For example, one or more sub word line driving units may be arranged to drive a selected one of the plurality of word lines to a ground voltage VSS level. The sub word line driving units 110, 120 are decentralized to reduce resistance in the word line.

The main word line driving unit 130 includes a driver configured to supply a ground voltage VSS to the sub word line driving unit 110 in response to a main word line signal GX0. Preferably, the driver comprises an NMOS transistor N9. The NMOS transistor N9 connects the node (A) to a ground voltage VSS terminal in response to the main word line signal GX0, and the gate of the NMOS transistor N9 receives the main word line signal GX0.

Preferably, the main word line signal GX0 is obtained by decoding upper bits XA3~XA9 of the row address. As described above, the circuit for decoding the upper bits XA3~XA9 of the row address is a typical decoding circuit, and therefore a detailed circuit is not included in FIG. 3. The gate width of the NMOS transistor N9 is preferably formed to be either identical to or larger than the sum of gate widths of the NMOS transistors N1~N8.

Although the embodiment shown in FIG. 3 shows a single NMOS transistor N9 for driving the eight word lines WL0~WL7, the present invention is not limited in this matter, as the number of word lines driven by the NMOS transistor N9 may be adjusting depending on the row address coding.

The main word line driving unit 140 includes a driver configured to supply a ground voltage VSS to the sub word line driving unit 120 in response to the main word line signal GX0. Preferably, the driver comprises an NMOS transistor N18. The NMOS transistor N18 connects the node (B) to the ground voltage VSS terminal in response to the main word line signal GX0, and the gate of the NMOS transistor N18 receives the main word line signal GX0. The gate width of the NMOS transistor N18 is preferably formed to be either identical to or larger than the sum of gate widths of the NMOS transistors N10~N17.

The precharge unit 150 includes a plurality of drivers configured to drive the word lines WL0~WL7 to a precharge voltage in response to the main word line signal GX0. Preferably, each driver comprises one of the PMOS transistors P1~P8. The precharge voltage may have a high voltage VPP level. Each of the PMOS transistors P1~P8 connect one of the word lines WL0~WL7 to the high voltage VPP terminal in response to the main word line signal GX0, and the gate of each of the PMOS transistors P1~P8 receives the main word line signal GX0.

Although the embodiment shown in FIG. 3 shows the PMOS transistors P1~P8 connected to eight word lines and driven by the main word line signal GX0, the present invention is not limited in this manner. The number of PMOS transistors may be adjusted depending on the row address coding. Preferably, the number of PMOS transistors is configured to be identical to the number of NMOS transistors in each sub word line driving unit 110 and 120.

The operation of the phase change memory device of FIG. 3 will now be explained.

When a precharge command is applied, the main word line signal GX0 is disabled (a low level). The PMOS transistors P1~P8 are turned on, and the NMOS transistors N9, N18 maintain an off state. Therefore, the word lines WL0~WL7 are precharged to the high voltage VPP level.

When an active command is applied, the main word line signal GX0 is enabled (a high level). The PMOS transistors P1~P8 are turned off, and the NMOS transistors N9, N18 are turned on. Therefore, the ground voltage VSS is transmitted to the nodes (A) and (B).

In this case, the sub word line signal LX0 selected from the plurality of sub word line signals LX0~LX7 is enabled (a high level). The remaining sub word line signals LX1~LX7 maintain a low level. As such, the NMOS transistors N1, N10 are turned on, and the NMOS transistors N2~N8, N11~N17 maintain an off state. Accordingly, the selected word line WL0 is driven to the ground voltage VSS level.

That is, in the embodiment of FIG. 3, the drivers configured to drive the word lines WL0~WL7 in response to the sub word line signal LX and the main word line signal GX are arranged so as to facilitate driving of the word line to the ground voltage VSS. The sub word line driving units 110, 120 are connected in series to the main word line driving units 130, 140, which prevents current reduction caused by the line resistance between the NMOS transistors.

In order to secure the number of transistors arranged in a pitch of the word line WL, the sub word line driving units 110, 120 are separated from the precharge unit 150. Therefore, space loss in the region between wells can be minimized.

Figure 4:
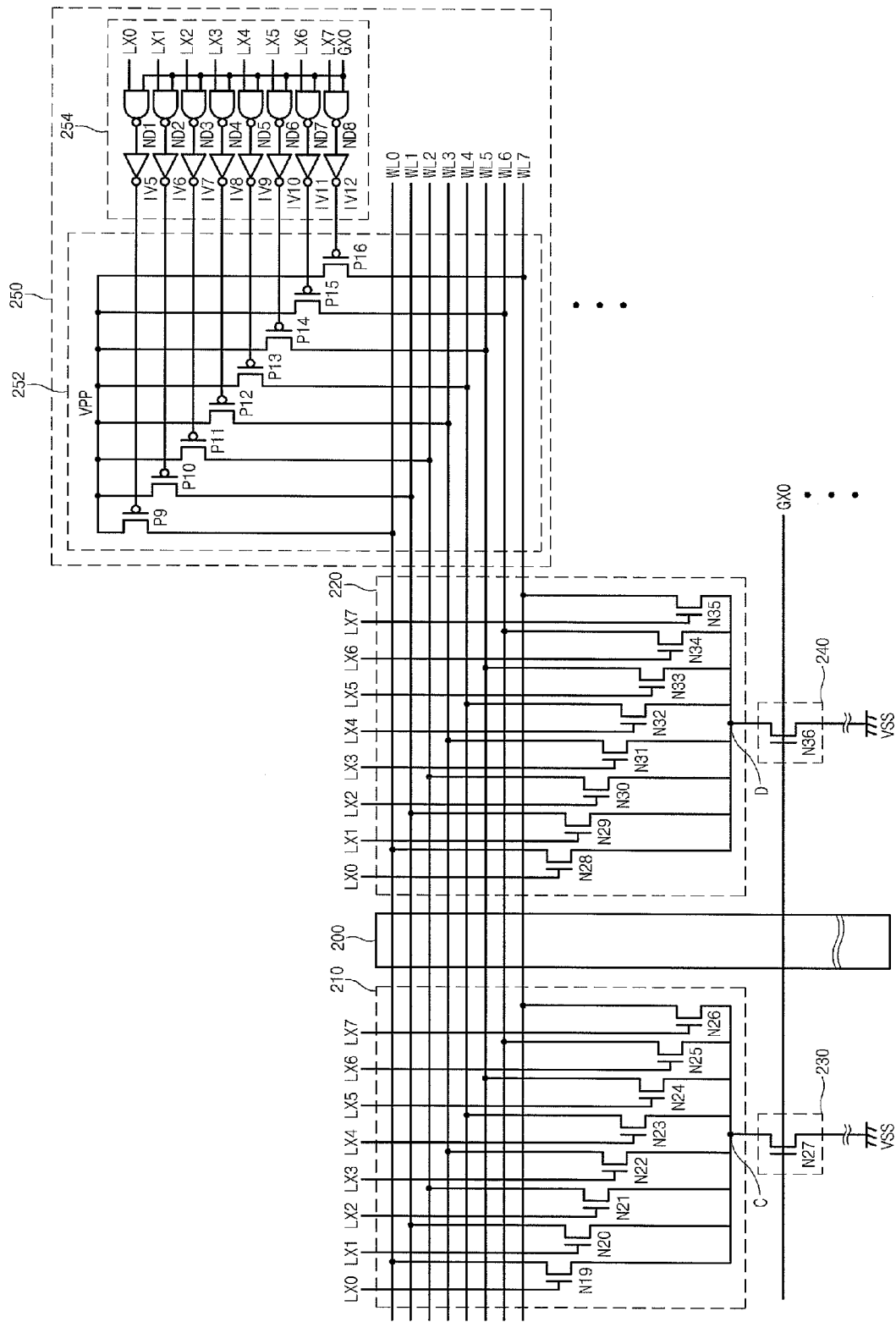
FIG. 4 is a circuit diagram showing a phase change memory according to an embodiment of the present invention.

FIG. 4 is a circuit diagram showing a phase change memory according to another embodiment of the present invention.

The phase change memory device of FIG. 4 comprises a cell array 200, sub word line driving units 210, 220, main word line driving units 230, 240, and a precharge unit 250.

The cell array 200 includes a plurality of unit phase change resistance cells (not shown) positioned at intersections of a plurality of bit lines (not shown) and a plurality of word lines WL0~WL7.

The sub word line driving unit 210 includes a plurality of drivers configured to drive one selected from the plurality of word lines WL0~WL7 to a ground voltage VSS level in response to a plurality of sub word line signals LX0~LX7. The drivers may comprise NMOS transistors N19~N26. Each of the NMOS transistors N19~N26 connect one of the word lines WL0~WL7 to a node (C) respectively in response to one of the sub word line signals LX0~LX7, and the gate of each of the NMOS transistors N19~N26 receive on of the sub word line signals LX0~LX7.

The sub word line driving unit 220 includes a plurality of drivers configured to drive one selected from the plurality of word lines WL0~WL7 to a ground voltage VSS level in response to the plurality of sub word line signals LX0~LX7. Preferably, the drivers comprise NMOS transistors N28~N35. Each of the NMOS transistors N28~N35 connect one of the word lines WL0~WL7 to a node (D) in response to the sub word line signals LX0~LX7, and the gate of each NMOS transistor N19~N26 receives one of the sub word line signals LX0~LX7.

The main word line driving unit 230 includes a driver configured to supply a ground voltage VSS to the sub word line driving unit 210 in response to a main word line signal GX0. Preferably, the driver comprises an NMOS transistor N27. The NMOS transistor N27 connects the node (C) to a ground voltage VSS terminal in response to the main word line signal GX0, and the gate of the NMOS transistor N27 receives the main word line signal GX0.

The main word line driving unit 240 includes a driver configured to supply a ground voltage VSS to the sub word line driving unit 220 in response to the main word line signal GX0. Preferably, the driver comprises an NMOS transistor N36. The NMOS transistor N36 connects the node (D) to the ground voltage VSS terminal in response to the main word line signal GX0, and the gate of the NMOS transistor N36 receives the main word line signal GX0.

The precharge unit 250 includes a driving unit 252 and a control unit 254. The driving unit 252 includes a plurality of drivers configured to drive the word lines WL0~WL7 to a precharge voltage in response to an output signal of the control unit 254. Preferably, the drivers comprise PMOS transistors P9~P16. Each of the PMOS transistors P9~P16 connects one of the word lines WL0~WL7 to a high voltage VPP terminal in response to output signals of the control unit, and the gate of each PMOS transistor P9~P16 receives one of the output signals of the control unit 254.

The control unit 254 includes a plurality of controllers configured to control the driving unit 252 in response to the main word line signal GX0 and the sub word line signals LX0~LX7. Preferably, the controllers include inverters IV5~IV12 and NAND gates ND1~ND9. Each of the inverters IV5~IV12 inverts an output signal of one of the NAND gates ND1~ND9. Each of the NAND gates ND1~ND9 performs a NAND logical operations on one of the sub word line signals LX0~LX7 and the main word line signal GX0.

The operation of the phase change memory device of FIG. 4 will now be explained.

When a precharge command is applied, the main word line signal GX0 is disabled (a low level). The PMOS transistors P9~P16 are turned on, and the NMOS transistors N27, N36 maintain an off state. Thus, the word lines WL0~WL7 are precharged to the high voltage VPP level.

When an active command is applied, the main word line signal GX0 is enabled (a high level). The sub word line signal LX0 selected from the sub word line signals LX0~LX7 is enabled (a high level). The remaining word line signals LX1~LX7 maintain a low level.

The PMOS transistor P9 is turned off, and the PMOS transistors P10~P16 maintain an on state. The NMOS transistors N27, N36 are turned on to drive the nodes (C) and (D) to the ground voltage VSS level.

The NMOS transistors N19, N28 that receive the sub word line signal LX0 are turned on to drive the word line WL0 to the ground voltage VSS level. In the embodiment of FIG. 4, the PMOS transistors P10~P16 maintain an on state in active mode. As a result, the non-selected word lines WL1~WL7 are fixed at the high voltage VPP level, which prevents leakage current from flowing to the word lines WL1~WL7.

Figure 5:
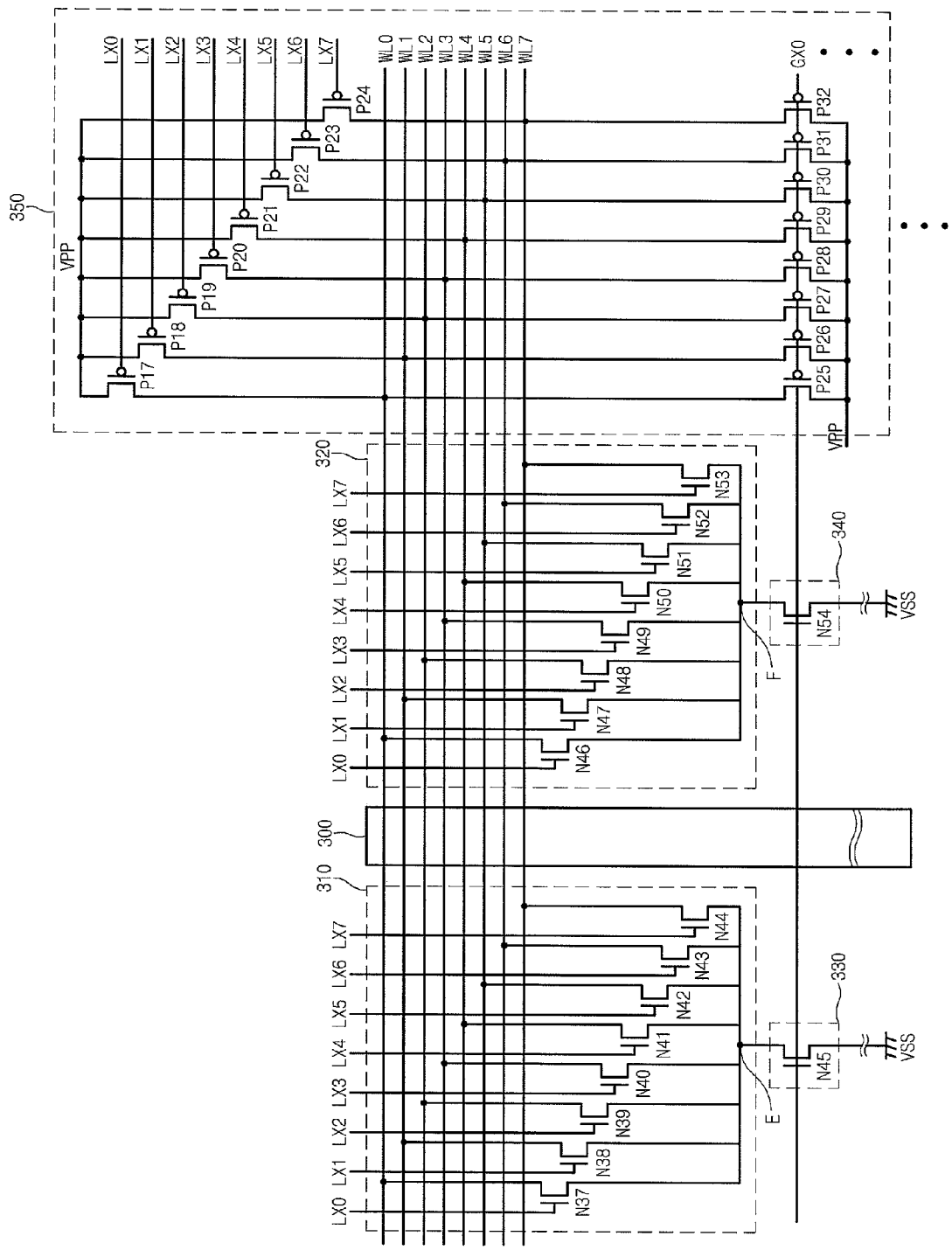
FIG. 5 is a circuit diagram showing a phase change memory according to an embodiment of the present invention.

FIG. 5 is a circuit diagram showing a phase change memory according to another embodiment of the present invention.

The phase change memory device of FIG. 5 comprises a cell array 300, sub word line driving units 310, 320, main word line driving units 330, 340, and a precharge unit 350.

The cell array 300 includes a plurality of unit phase change resistance cells (not shown) positioned at intersections of a plurality of bit lines (not shown) and a plurality of word lines WL0~WL7.

The sub word line driving unit 310 includes a plurality of drivers configured to drive one selected from the plurality of word lines WL0~WL7 to a ground voltage VSS level in response to sub word line signals LX0~LX7. Preferably, the drivers comprises NMOS transistors N37~N44. Each of the NMOS transistors N37~N44 connects one of the word lines WL0~WL7 to a node (E), the gate of each of the NMOS transistors N37~N44 receives one of the sub word line signals LX0~LX7.

The sub word line driving unit 320 includes a plurality of drivers configured to drive one selected from the plurality of word lines WL0~WL7 to the ground voltage VSS level in response to the sub word line signals LX0~LX7. Preferably, the drivers comprise NMOS transistors N46~N53. Each NMOS transistor N46~N53 connects one of the word lines WL0~WL7 to a node (F), and the gate of each NMOS transistor N46~N53 receives one of the sub word line signals LX0~LX7.

The main word line driving unit 330 includes a driver configured to supply a ground voltage VSS to the sub word line driving unit 310 in response to a main word line signal GX0. Preferably, the driver comprises an NMOS transistor N45. The NMOS transistor N45 connects the node (E) to a ground voltage VSS terminal in response to the main word line signal GX0, and the gate of the NMOS transistor N45 receives the main word line signal GX0.

The main word line driving unit 340 includes a driver configured to supply a ground voltage VSS to the sub word line driving unit 320 in response to the main word line signal GX0. Preferably, the driver comprises an NMOS transistor N54. The NMOS transistor N54 connects the node (F) to the ground voltage VSS terminal in response to the main word line signal GX0, and the gate of the NMOS transistor N54 receives the main word line signal GX0.

The precharge unit 350 includes a plurality of first drivers and a plurality of second drivers. The first drivers are configured to drive the word lines WL0~WL7 to a precharge voltage in response to the sub word line signals LX0~LX7. The second drivers are configured to drive the word lines WL0~WL7 to the precharge voltage in response to the main word line signal GX0. Preferably, the first drivers comprise PMOS transistors P17~P24. Each of the PMOS transistors P17~P24 connects one of the word lines WL0~WL7 to a high voltage VPP terminal, and the gate of each of the PMOS transistors P17~P24 receives one of the sub word line signals LX0~LX7.

Preferably, the second drivers comprise PMOS transistors P25~P32. Each of the PMOS transistors P25~P32 connects one of the word lines WL0~WL7 to the high voltage VPP terminal, and the gate of each of the PMOS transistors P25~P32 receives the main word line signal GX0.

The operation of the phase change memory device of FIG. 5 will now be explained.

When a precharge command is applied, the main word line signal GX0 is disabled (a low level). As such, the sub word line signals LX0~LX7 maintain a low level.

The PMOS transistors P17~P32 are turned on, and the NMOS transistors N45, N54 maintain an off state. Thus, the word lines WL0~WL7 are precharged to the high voltage VPP level.

When an active command is applied, the main word line signal GX0 is enabled (a high level). The PMOS transistors P25~P32 are turned off, and the NMOS transistors N45, N54 are turned on.

The nodes (E) and (F) are driven to the ground voltage VSS level. The sub word line signal LX0 selected from the sub word line signals LX0~LX7 is enabled (a high level), and the remaining sub word line signals LX1~LX7 maintain a low level.

Accordingly, when the word line WL0 is selected, the PMOS transistor P17 is turned off, and the PMOS transistors P18~P24 maintain an on state. The NMOS transistors N37, N46 that receive the sub word line signal LX0 are turned on to drive the selected word line WL0 to the ground voltage VSS level.

In the embodiment of FIG. 5, when the device is in precharge mode, the PMOS transistors P17~P32 positioned at both sides of the word lines WL0~WL7 are all turned on, thereby improving driving capacity. In active mode, the PMOS transistors P18~P24 maintain an on state. As a result, the non-selected word lines WL1~WL7 are fixed at the high voltage VPP level, which prevents leakage current from flowing to the word lines WL1~WL7.

As described above, in a phase change memory device according to an embodiment of the present invention, driving units for driving word lines to a ground voltage are decentralized in the word line to minimize the resistance in the word line.

In the phase change memory device according to an embodiment of the present invention, word lines are hierarchical-driven using a main word line signal and a sub word line signal to maximize current sink capacity.

In the phase change memory device according to an embodiment of the present invention, a plurality of word lines are controlled simultaneously using a single main word line signal to reduce the size of a row address decoder.

In the phase change memory device according to an embodiment of the present invention, a driver controlled by a main word line signal is in series to a driver controlled by a sub word line signal to minimize current reduction resulting from line resistance.

In the phase change memory device according to an embodiment of the present invention, a non-selected word line is fixed at a high voltage level in an active mode to prevent leakage current caused by a floating word line.

Although a number of illustrative embodiments consistent with the invention have been described, it should be understood that numerous other modifications and embodiments can be devised by those skilled in the art that will fall within the spirit and scope of the present invention. More particularly, a number of variations and modifications are possible in the component parts and/or arrangements that are within the scope of the disclosure, the drawings, and the accompanying claims. In addition to variations and modifications in the component parts and/or arrangements, alternative uses will also be apparent to those skilled in the art.

What is claimed is:

1. A phase change memory device having a plurality of intersecting bit lines and word lines, the phase change memory device comprising:
    a cell array comprising a plurality of unit phase change resistance cells, each of which is formed at the intersection of a bit line and a word line;
    one or more sub word line driving units, each of which is configured to drive the word lines in response to a plurality of sub word line signals;
    one or more main word line driving units, each of which is configured to drive a corresponding one of the one or more sub word line driving units in response to a main word line signal; and
    a precharge unit configured to precharge the word lines.

2. The phase change memory device according to claim 1, wherein each of the one or more main word line driving units comprises a first driver configured to connect the corresponding sub word line driving unit to a ground voltage in response to the main word line signal.

3. The phase change memory device according to claim 2, wherein each of the sub word line driving units comprises a plurality of second drivers each of which is configured to selectively drive a corresponding one of the plurality of word lines by an output signal of the first driver in response to a corresponding one of the sub word line signals.

4. The phase change memory device according to claim 3, wherein the first driver and each of the second drivers are connected in series between the corresponding word line and a terminal for receiving the ground voltage.

5. The phase change memory device according to claim 3, wherein the first driver and each of the second drivers comprise a MOS transistor.

6. The phase change memory according to claim 5, wherein a gate width of the first driver of any one of the main word line driving units is formed to be identical to or greater than the sum of each of the gate widths of the second drivers of the corresponding sub word line driving unit.

7. The phase change memory device according to claim 1, wherein the sub word line signals are obtained by decoding a plurality of lower bits of a row address.

8. The phase change memory device according to claim 7, wherein the main word line signal is obtained by decoding the remaining bits of the row address.

9. The phase change memory device according to claim 1, wherein the precharge unit comprises a plurality of third drivers configured to selectively drive each of the word lines to a precharge voltage in response to the main word line signal.

10. The phase change memory device according to claim 1, wherein the precharge unit comprises:
   a control unit configured to output a plurality of control signals, each of which is output in response to the main word line signal and a corresponding one of the plurality of sub word line signals; and
   a driving unit configured to drive the word lines to a precharge voltage in response to the plurality of control signals.

11. The phase change memory device according to claim 10, wherein the control unit activates a control signal of the plurality of control signals when both the main word line signal and the corresponding sub word line signal are activated.

12. The phase change memory device according to claim 10, wherein the driving unit comprises a plurality of fourth drivers each of which is configured to selectively drive a corresponding one of the word lines to the precharge voltage in response to a corresponding one of the control signals.

13. The phase change memory device according to claim 1, wherein the precharge unit comprises:
   a plurality of fifth drivers each of which is configured to selectively drive a corresponding one of the word lines to a precharge voltage in response to a corresponding one of the plurality of sub word line signals; and
   a plurality of sixth drivers configured to drive the word lines to the precharge voltage in response to the main word line signal.

14. The phase change memory device according to claim 1, wherein the sub word line driving units are disposed at both sides of the cell array.

* * * * *